United States Patent
Goerlach

(10) Patent No.: US 6,262,466 B1
(45) Date of Patent: *Jul. 17, 2001

(54) LATERAL SEMICONDUCTOR STRUCTURE FOR FORMING A TEMPERATURE-COMPENSATED VOLTAGE LIMITATION

(75) Inventor: Alfred Goerlach, Kusterdingen (DE)

(73) Assignee: Robert Bosch GmbH, Stuttgart (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/968,003

(22) Filed: Nov. 12, 1997

Related U.S. Application Data

(63) Continuation of application No. 08/605,122, filed as application No. PCT/DE95/00814 on Jun. 22, 1995.

(30) Foreign Application Priority Data

Jul. 6, 1994 (DE) .................................................. 44 23 619

(51) Int. Cl.$^7$ .............................. H01L 29/00; H01L 23/58
(52) U.S. Cl. .......................... 257/497; 257/494; 257/495; 257/498
(58) Field of Search .................................... 257/104, 106, 257/497, 498, 494, 495, 603

(56) References Cited

U.S. PATENT DOCUMENTS

| 4,608,582 | 8/1986 | Nishizawa | 357/22 |
|---|---|---|---|
| 4,672,402 | 6/1987 | Yamoaka et al. | 357/13 |
| 4,825,266 | * 4/1989 | Whight | 257/494 |
| 4,831,424 | 5/1989 | Yoshida et al. | 357/23.13 |
| 5,181,083 | 1/1993 | Pezzani | 257/491 |
| 5,233,214 | 8/1993 | Görlach et al. | 257/469 |
| 5,969,400 | * 10/1999 | Shinohe et al. | 257/495 |

FOREIGN PATENT DOCUMENTS

| 3411878A1 | 3/1984 | (DE) | 257/367 |
|---|---|---|---|
| 0 467803A1 | 7/1991 | (EP) | 257/656 |
| 0 485059A2 | 9/1991 | (EP) | 257/656 |

* cited by examiner

*Primary Examiner*—Steven Loke
(74) *Attorney, Agent, or Firm*—Kenyon & Kenyon

(57) ABSTRACT

A lateral semiconductor structure having a punch-through diode for forming a temperature-compensated voltage limitation in which the space charge resistance is reduced through a lateral arrangement of preferably annular regions around a base trough. This is achieved in that the preferably annular regions are arranged with a specific doping as well as a specific separation from the base trough. By using the punch-through and avalanche effects, a higher breakdown voltage is achieved since the space charge resistance is reduced by the chosen arrangement.

11 Claims, 2 Drawing Sheets

LATERAL SEMICONDUCTOR STRUCTURE FOR FORMING A TEMPERATURE-COMPENSATED VOLTAGE LIMITATION

CROSS REFERENCE TO RELATED APPLICATION

This application is a continuation application of application Ser. No. 08/605,122, filed Jun. 27, 1996 now abandoned, which is a 371 of PCT/DE95/00814, filed Jun. 22, 1995.

BACKGROUND INFORMATION

The present invention starts out from a lateral semiconductor structure having a punch-through diode for forming a temperature-compensated voltage limitation. It is already known to use punch-through diodes for voltage limitation in silicon semiconductor structures. Punch-through diodes are $p^+np^+$ or rather $n^+pn^+$ silicon structures in which the width and doping of the middle region are chosen so that when a voltage is applied to the two outer layers, no avalanche effect or rather zener effect occurs. If the voltage is increased, the space charge region of the blocking pn junction expands until it contacts the opposite junction. This pn junction operated in the conducting state injects charge carriers into the field of the space charge region, i.e., the current increases significantly starting at this voltage. The current/voltage characteristic curve of a punch-through diode is, at least for certain current densities, practically independent of temperature. In the space charge region, there exists for sufficiently high current densities a linear relationship between the current and the voltage, which is known as the space charge resistance. This space charge resistance is proportional as an approximation to the square of the expansion of the middle region. Since the punch-through voltage increases more or less with the square of the width of the middle region, the space charge resistance increases linearly for increasing voltage. Here, the problem arises that for high limitation voltages, the space charge resistance increases undesirably significantly. The known punch-through diodes are thus suited only to relatively small current densities.

SUMMARY OF THE INVENTION

In contrast, the lateral semiconductor structure according to the present invention has the advantage that the space charge resistance is decreased so that higher limitation voltages can also be attained with punch-through diodes. This is achieved advantageously in that one of the semiconductor regions of the same kind is designed as a floating region.

Another embodiment of the present invention utilizes a specified separation between the base trough and the further p-doped region which determines as a first approximation the resistance of the space charge region. Since the space charge region in the further p-doped region is not so sharply formed as in the weakly n-doped region, a smaller space charge resistance overall is obtained with the arrangement according to the present invention. Accordingly, a higher breakdown voltage can be achieved advantageously for the same blocking-state current.

Due to the partial overlapping of the further p-doped region with the highly n-doped region, a smaller separation from the edge region of the structure is obtained advantageously so that the semiconductor structure can be designed smaller overall.

Yet another embodiment of the present invention to obtain a further reduction of the space charge resistance is achieved in that a specified separation is provided between the further p-doped region and the highly n-doped region. Through the choice of a suitable separation between the further p-doped region and the highly n-doped region, the avalanche breakdown voltage can be influenced.

If a third p-doped region is inserted between the base trough and the further p-doped region, the resistance of the breakdown characteristic curve is reduced even further. It is also advantageous that no avalanche breakdown is required so that the reverse voltage is independent of temperature for certain current densities.

Since the semiconductor structure can be designed with npn as well as with pnp structures, a universal application is possible, in particular for base collector (BC) clamping of power transistors or switching transistors. Such structures are connected advantageously on a chip with integrated circuits.

DETAILED DESCRIPTION OF THE INVENTION

Figure 1:
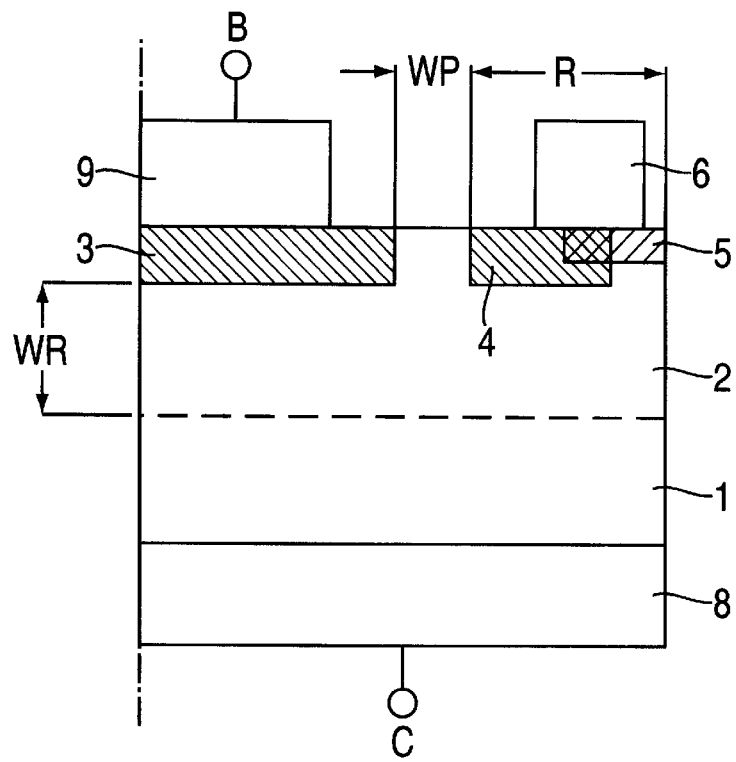
FIG. 1 shows a sectional view of a known $pn^+p^+$ punch-through limitation.

FIG. 1 shows a known lateral $p^+np^+$ punch-through structure in a sectional view, the oxide layers located on the front side of the semiconductor chip or other structures such as emitter islands of an npn transistor not being drawn in—as in the other figures—for reasons of clarity. The depiction in sectional view given in FIG. 1 shows the cross-section of a semiconductor chip in which a highly n-doped region 1 is located in the lower area. Over this, a weakly n-doped region 2 is arranged. The back side of the highly n-doped region 1 is entirely or partially covered with a metallic coating 8 to which the terminal C (collector terminal) is run. A p-doped base trough 3 is diffused inwards into the weakly n-doped region 2. The width of the weakly n-doped semiconductor region between the regions 1 and 3 is designated as WR. Simultaneously with the base region, a further p-doped region 4 is introduced which is recognizable in the upper right part of FIG. 1. It is preferably run annularly around the base trough, it having a separation WP from the base trough. The region 4 is partially overlapped on the outer side by a highly n-doped region 5 and extends, for example, to the edge of the chip. The regions 4 and 5 are galvanically connected with a common metal contact 6, which can also be run annularly around the base trough 3. The base trough 3 has on the top side likewise at least partially a metallic coating 9 to which a terminal B (base terminal) runs. R is used to designate the separation parallel to the surface between the chip edge and the inner border of the highly p-doped region 4.

If a reverse voltage is now applied between B and C, a space charge region spreads out in the weakly n-doped region 2. If the space charge region reaches the p-doped region 4, a current can flow between B and C since the region 4 is connected via the metallic jumper 6 to the region 5 and thus via the n-doped regions 2 and 1 via the metallic coating 8 to the terminal C. A further voltage rise is no longer possible. The voltage at which a voltage limitation occurs is called the punch-through voltage UPT. It is approximately proportional to the square of the width WP and the donator concentration ND in the region 2. Here, the width WP must be chosen so that the avalanche breakdown voltage of the pn junction formed by the regions 3 and 2 is greater than the punch-through voltage between the regions 3 and 4. A disadvantage of this arrangement is the high resistance of the reverse characteristic curve, particularly if high reverse voltages must be realized.

Figure 2:
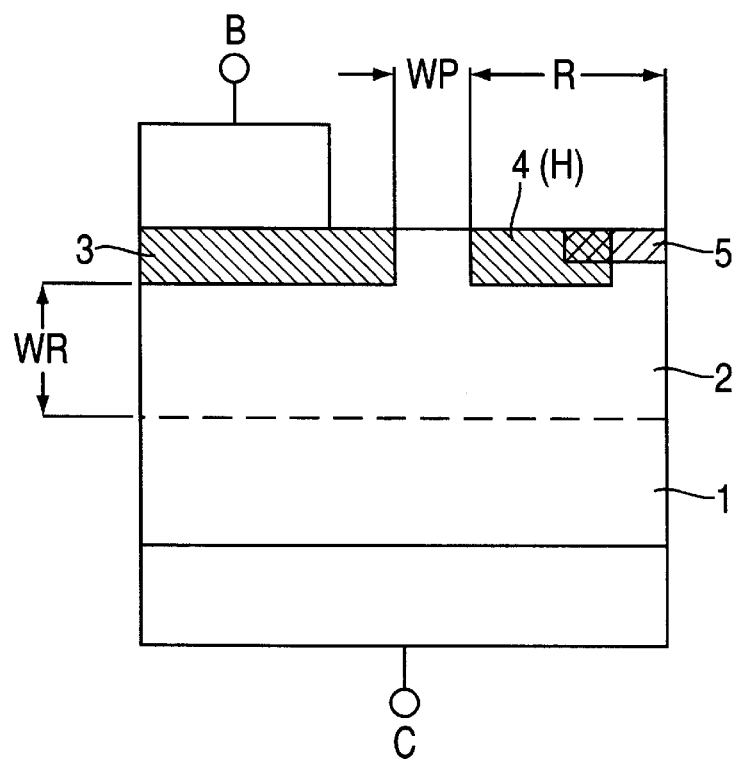
FIG. 2 illustrates a lateral semiconductor structure, according a preferred embodiment of the present invention.
Figure 3:
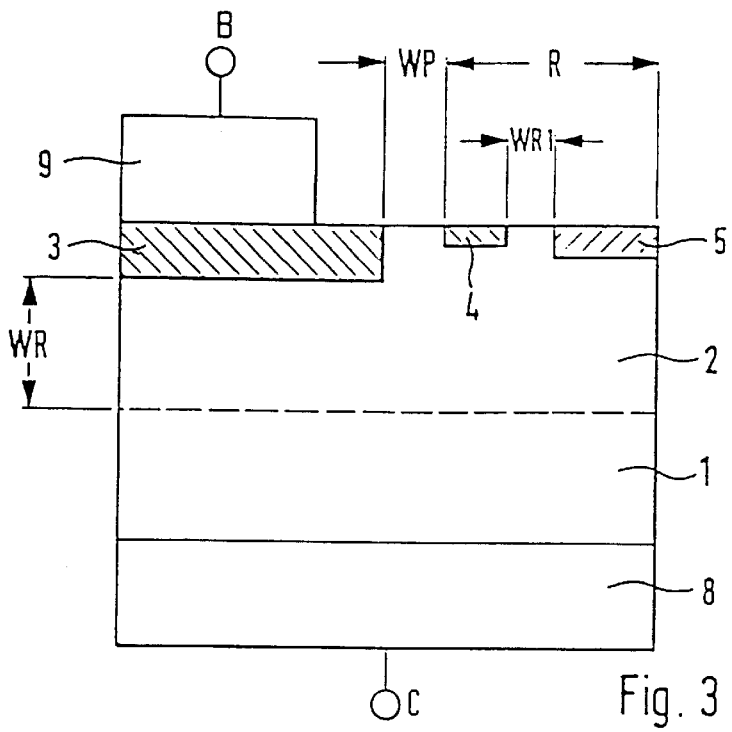
FIG. 3 illustrates another embodiment of the present invention.
Figure 4:
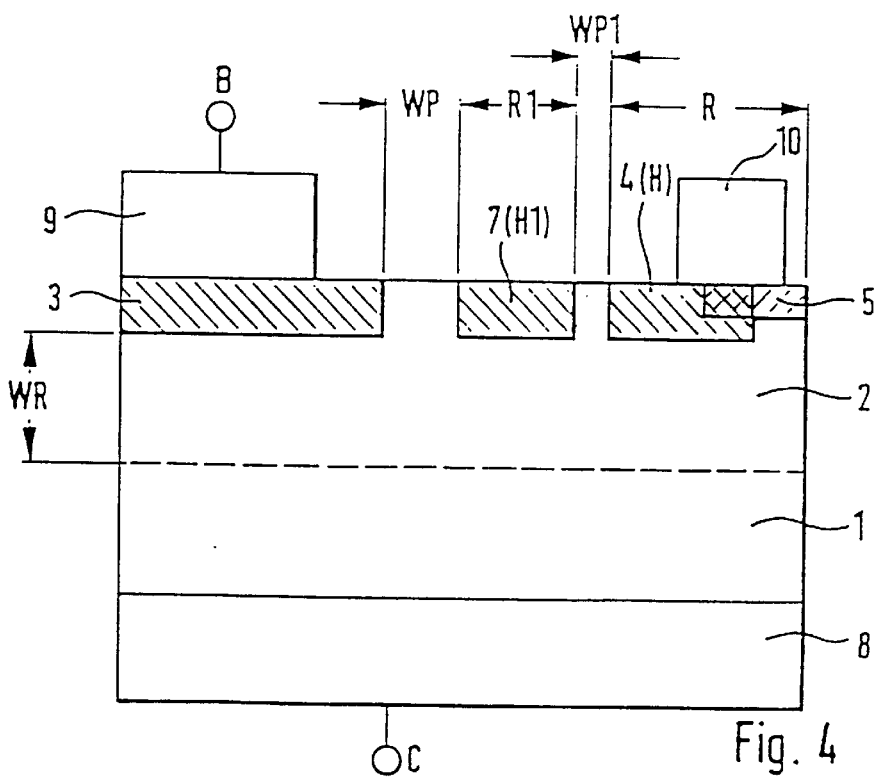
FIG. 4 shows yet another embodiment of the present invention.

FIGS. 2 to 4 show exemplary embodiments according to the present invention in basic sectional views in which the resistance of the reverse characteristic curve is reduced with respect to the above example so that higher reverse voltages can also be realized.

For the sake of simplicity, the designations from FIG. 1 are used in FIGS. 2 to 4 for identical regions. In the first exemplary embodiment according to the present invention as shown in FIG. 2, the metal contact 6 was left out so that the regions 4 and 5 are no longer galvanically connected. Now, the region 5 does not necessarily have to have the same doping profile as, for example, an emitter layer (not shown). In particular, the region 5 can also be more weakly doped. By omitting the metal contact or ring 6, the separation R in an arrangement according to FIG. 2 can be designed smaller than in the arrangement according to FIG. 1 since the space required for making contact with the metal ring 6 in the p-doped region 4 as well in the n-doped region 5 is no longer needed.

Besides the advantage of a chip area reduction compared to a structure as shown in FIG. 1, the space charge resistance $R_{sc}$ is also reduced. When a reverse voltage is applied between the metal contacts B and C, a space charge region forms between the regions 3 and 2. If the reverse voltage is increased, the space charge region spreads out more until it runs into the p-doped semiconductor region 4 (punch-through). If the reverse voltage is further increased, the ring potential of the region 4 increases. The increase does not grow to the same extent as the reverse voltage increases. If the potential of the floating ring reaches the avalanche breakdown voltage of the pn junction consisting of the p-doped region 4 and the n-doped region 5, then the pn junction 4, 5 becomes conductive. A current path forms from the contact B via the regions 9, 3, 2, 4, 5, 2, 1, 8 to the terminal C (collector). A combination of the punch-through and avalanche effects acts as a limitation.

Since the potential of the p-doped region 4 does not increase to the same extent as the reverse voltage, the potential difference between the terminal B and the region 4 must increase. As a result, for an unaltered separation WP, more voltage is present between the regions 3 and 4 than for a simple punch-through. Since, however, the width WP and thus the space charge resistance $R_{sc}$ do not change, the resulting resistance of the breakdown characteristic curve is less than in the case of a simple punch-through limitation.

This applies in the case in which the expansion of the space charge region below the base trough 3 is less than in WR (non-reach-through) as well as in the case in which the space charge region below the base region extends to the highly n-doped region 1 (reach-through).

For non-reach-through, the following holds as an approximation with the following abbreviations:

QW=square root function
UA=potential (magnitude) at region 3
UH=potential (magnitude) at region 4
UPT=voltage magnitude for punch-through between regions 3 and 4
URT=voltage magnitude for reach-through between regions 3 and 1.

For the punch-through condition, the following equation holds:

$$UA-UH=2*QW(UPT*UA)-UPT>UPT \quad (1)$$

In the reach-through case, the following holds as an approximation for the pn junction which is abrupt on one side:

$$UH=(1-(WP/(WP+WR))*UA -((WR/(WP+WR))^{2}*QW(UPT*URT) \quad (2)$$

The slope of UA is less than 1, i.e., the potential rise of the ring potential in the region 4 is less than the rise of UA.

It is assumed in turn that the reverse voltage between the base B and the collector C does not exceed the avalanche breakdown voltage of the; base collector junction.

The potential difference (UA–UH) between the regions 3 and 4 is—due to the slower rise of UH—greater than for a simple punch-through voltage. The space charge resistance is a function of the square of the separation of the two p-doped regions. Thus, for an identical reverse voltage, the arrangement of the width WP can be designed smaller in the exemplary embodiment of the present invention than in a simple punch-through structure according to FIG. 1. The space charge resistance decreases as a result. This entails a lower current dependency for the limitation voltage. The space charge resistance of the avalanche diode in the regions 4 and 5 is added to the space charge resistance between the regions 3 and 4.

FIG. 3 shows a second exemplary embodiment of the present invention in a sectional view. Unlike the arrangement according to FIG. 2, the doping of the p-doped region 4 is now distinguished from the doping of the base trough 3. The doping of the further p-doped region 4 (floating) is now chosen so that its avalanche breakdown voltage is less than the avalanche breakdown voltage of the base trough 3. Moreover, the region 4 no longer overlaps the n-doped region 5, but instead is separated from it by a distance WR1. The remaining designations are used as before.

The advantage according to the present invention of this structure, compared with the arrangement shown in FIG. 1, lies again in the reduced space charge resistance $R_{sc}$. When a reverse voltage is applied between the terminals B and C, the space charge region between the regions 3 and 2 spreads out until it runs into the region 4 (punch-through). If the reverse voltage is further increased, the ring potential of the region 4 increases, although it does not increase to the same extent as the reverse voltage. If the potential of the floating ring of the region 4 reaches the avalanche breakdown voltage (pn junction 4, 2), then current flow to the collector is created. There exist's a current path from terminal B via the regions 9, 3, 2, 4, 2, 1 and 8 to the collector terminal C. As before, a combination of the punch-through and avalanche effects acts as a limitation. It is also possible to influence the avalanche breakdown voltage of the p-doped region 4 through a suitable choice of the separation WR1 between the regions 4 and 5.

Since the potential of the p-doped region 4 again does not increase to the same extent, the resistance of the breakdown characteristic curve is—analogous to the structure according to FIG. 2—less than in the case of a simple punch-through limitation.

The reduction of the space charge resistance $R_{SC}$ through voltage limitation according to FIGS. 2 or 3 amounts to, in the case in which the space charge region under the base does not reach the highly doped n-layer 1 (non-reachthrough), for a reverse voltage UA=400 V about 100%, if the punch-through voltage UPT between region 3 and 4 is rated at 100 V for a doping of the region 2 of ND=1 E 14 cm$^{-2}$.

Since the voltage limitation in the exemplary embodiments show in FIGS. 2 and 3 is based on a combination of the punch-through and avalanche effects, the reverse voltage is no longer completely independent of temperature. The avalanche breakdown voltage has a positive temperature coefficient which is dependent on the magnitude of the avalanche voltage. However, the influence of the avalanche effect on the temperature dependency of the entire reverse voltage can be reduced by keeping the avalanche share small. In the above example, the avalanche breakdown voltage is only approx. 36 V, whereas the reverse voltage lies at approx. 400 V.

A way of altogether eliminating this minor disadvantage is presented in the third exemplary embodiment of the present invention shown in FIG. 4.

There, a structure is presented in cutaway portions in a sectional view in which now only the non-temperature-dependent punch-through effect is used for voltage limitation. As a further advantage with respect to the simple punch-through, an increased potential is present between the p-doped regions.

The third exemplary embodiment of the present invention shown in FIG. 4 is distinguished in particular from the embodiment of the present invention shown in FIG. 1 chiefly in that a third, preferably annularly running p-doped region 7 is also arranged between the base trough 3 and the further p-doped region 4. The separation from the base trough 3 is again designated as WP, and the separation from region 4 as WP1. The doping can be chosen like the base doping or rather the doping of the region 4. As before, an emitter layer which might be present is not drawn in. Likewise as before, oxide layers are not shown.

The advantage of this structure lies again in the reduced space charge resistance $R_{SC}$, compared with the structure according to FIG. 1. When a reverse voltage is applied between the contacts B and C, the space charge region between the regions 3 and 2 spreads out until it now runs into the third p-doped region 7. If the reverse voltage is further increased, the potential of region 7 increases—although not to the same extent as the reverse voltage—until the space charge region runs into the region 4. A current path then exists from terminal B with the metallic coating 9 via the regions 3, 2, 7, 2, 4, 10, 5, 2, 1 and 8 to terminal C.

Since, as before, the potential of the p-doped region 4 does not increase to the same extent, the resistance of the breakdown characteristic curve is less than in the case of a simple punch-through limitation. Since no avalanche breakdown is required, the reverse voltage is non-temperature-dependent, at least for certain current densities.

The metal ring 10 can also be omitted as an alternative.

Then, the potential of region 4 increases up to the breakdown voltage of the pn region 4, 5, analogous to the exemplary embodiment from FIG. 2. Basically, a metal region can also be located over the region 7. It can be separated by a dielectric or galvanically connected to region 7.

What is claimed is:

1. A lateral semiconductor structure having a punch-through diode forming a temperature-compensated voltage limitation, comprising:
   a first p-doped region;
   a first n-doped region, the first p-doped region being diffused into the first n-doped region;
   a second p-doped region arranged as a first ring around the first p-doped region and being insulated from the first p-doped region, a doping of the second p-doped region being greater than a doping of the first p-doped region; and
   a second n-doped region arranged as a second ring around the second p-doped region, the first and second rings being concentric, the doping of the second n-doped region being greater than the doping of the first n-doped region, the second p-doped region floating relative to the second n-doped region; wherein
   the first p-doped region, the second floating p-doped region and the first n-doped region form the punch-through diode,
   the second p-doped region and the first n-doped region define a first p-n junction, and
   the first n-doped region and the first p-doped region defining a second p-n junction, the punch-through diode having a breakdown voltage determined as a function of a punch-through effect of the second p-n junction and an avalanche effect of the first p-n junction.

2. The semiconductor structure as recited in claim 1, wherein the second p-doped region has a first predetermined separation from the first p-doped region.

3. The semiconductor structure as recited in claim 1, wherein the second p-doped region has a predetermined separation from the second n-doped region.

4. The semiconductor structure as recited in claim 1, wherein the semiconductor structure has invertible polarities.

5. The semiconductor structure as recited in claim 1, further comprising a base-collector clamp for integrating with at least one element of a chip.

6. The semiconductor structure as recited in claim 1, wherein a base-collector clamp is used for voltage limitation.

7. The semiconductor structure as recited in claim 6, wherein the base-collector clamp is used for clamping of at least one switching transistor.

8. The semiconductor structure as recited in claim 6, wherein the base-collector clamp is used for clamping of at least one ignition transistor.

9. The semiconductor structure as recited in claim 1, wherein the first p-doped region includes a p-doped base trough.

10. The semiconductor structure as recited in claim 1, wherein the second p-doped region concentrically surrounds the first p-doped region.

11. The semiconductor structure as recited in claim 1, wherein the second p-doped region floats relative to the first p-doped region.

* * * * *

UNITED STATES PATENT AND TRADEMARK OFFICE
CERTIFICATE OF CORRECTION

PATENT NO.     : 6,262,466 B1
DATED          : July 17, 2001
INVENTOR(S)    : Goerlach, Alfred It is certified that error appears in the above-identified patent and that said Letters Patent is hereby corrected as shown below:

<u>Column 2,</u>
Line 17, change "circuits." to -- circuits. Indeed, the structures can be integrated with other elements on the chip. In addition, the polarities of the stuructures are invertible --

<u>Column 5,</u>
Line 5, change "show" to -- shown --

Signed and Sealed this

Twenty-eighth Day of January, 2003

JAMES E. ROGAN
*Director of the United States Patent and Trademark Office*